United States Patent
Miyata

(10) Patent No.: US 9,118,005 B2
(45) Date of Patent: Aug. 25, 2015

(54) MANUFACTURING METHOD OF A MEMORY DEVICE WITH A REVERSIBLE VARIABLE-RESISTANCE MEMORY LAYER BETWEEN ELECTRODES EXTENDING ALONG INTERSECTING DIRECTIONS

(75) Inventor: Koji Miyata, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 161 days.

(21) Appl. No.: 13/271,537

(22) Filed: Oct. 12, 2011

(65) Prior Publication Data

US 2012/0091428 A1 Apr. 19, 2012

(30) Foreign Application Priority Data

Oct. 19, 2010 (JP) .................................. 2010-234414

(51) Int. Cl.
*H01L 27/115* (2006.01)
*H01L 45/00* (2006.01)
(Continued)

(52) U.S. Cl.
CPC ........ *H01L 45/1266* (2013.01); *G11C 13/0002* (2013.01); *H01L 27/2436* (2013.01); *H01L 27/2472* (2013.01); *H01L 45/085* (2013.01);
(Continued)

(58) Field of Classification Search
CPC . H01L 27/24; H01L 27/2409; H01L 27/2427; H01L 27/2436; H01L 27/2472; H01L 27/249; H01L 45/06; H01L 45/08; H01L 45/141; H01L 45/1233; H01L 45/144; H01L 45/146; H01L 45/1691; H01L 27/2454; H01L 27/2463; G11C 13/0002
USPC .................. 438/102, 382, 467, 900; 257/4, 5, 257/E47.005
See application file for complete search history.

(56) References Cited

U.S. PATENT DOCUMENTS 6,740,921 B2 * 5/2004 Matsuoka et al. ............ 257/302
8,268,713 B2 * 9/2012 Yamagishi et al. ........... 438/608
(Continued)

FOREIGN PATENT DOCUMENTS

CN 101060129 A 10/2007
CN 101859871 A 10/2010
(Continued)

OTHER PUBLICATIONS

Japanese Office Action dated May 27, 2014, issued in connection with counterpart Japanese Patent Application No. 2010-234414.
(Continued)

*Primary Examiner* — Anh Mai
(74) *Attorney, Agent, or Firm* — Dentons US LLP

(57) ABSTRACT

A manufacturing method of a memory apparatus in which memory devices each having a memory layer whose resistance value reversibly varies by voltage application between bottom and upper electrodes are formed, includes: forming and shaping a bottom electrode material film into a first linear pattern extending in a first direction; forming a memory layer material film and an upper electrode material film in this order on the bottom electrode material film; forming the upper electrodes and the memory layers by shaping the upper electrode material film and the memory layer material film into a second linear pattern extending in a second direction intersecting with the first direction; and forming the bottom electrodes having a quadrangle plane shape at regions where the first linear pattern intersect with the second linear pattern by shaping the bottom electrode material film into the second linear pattern.

11 Claims, 11 Drawing Sheets

(51) Int. Cl.
*G11C 13/00* (2006.01)
*H01L 27/24* (2006.01)

(52) U.S. Cl.
CPC .......... *H01L 45/1233* (2013.01); *H01L 45/144* (2013.01); *H01L 45/146* (2013.01); *H01L 45/1691* (2013.01)

(56) References Cited

U.S. PATENT DOCUMENTS

| | | | |
|---|---|---|---|
| 8,853,663 B2* | 10/2014 | Sumino | 257/4 |
| 2006/0189045 A1 | 8/2006 | Shum et al. | |
| 2008/0083918 A1* | 4/2008 | Aratani et al. | 257/5 |
| 2009/0039337 A1* | 2/2009 | Ohba et al. | 257/4 |
| 2009/0134432 A1 | 5/2009 | Tabata | |
| 2010/0243980 A1 | 9/2010 | Fukumizu | |
| 2011/0140065 A1* | 6/2011 | Maesaka et al. | 257/2 |
| 2011/0240948 A1* | 10/2011 | Kagawa | 257/4 |

FOREIGN PATENT DOCUMENTS

| | | |
|---|---|---|
| CN | 101499437 | 7/2013 |
| JP | 2003 229537 A | 8/2003 |
| JP | 2009 043758 A | 2/2009 |
| JP | 2009 130140 A | 6/2009 |
| JP | 2009 181971 | 8/2009 |
| WO | 2008117371 | 10/2008 |
| WO | 2010079816 A1 | 7/2010 |

OTHER PUBLICATIONS

Chinese Office Action dated Sep. 19, 2014, issued in connection with counterpart Chinese Application No. 201110299670.4.

* cited by examiner

MANUFACTURING METHOD OF A MEMORY DEVICE WITH A REVERSIBLE VARIABLE-RESISTANCE MEMORY LAYER BETWEEN ELECTRODES EXTENDING ALONG INTERSECTING DIRECTIONS

FIELD

The present disclosure relates to a manufacturing method of a memory apparatus including memory devices capable of storing information by variation of electric characteristics in memory layers, a memory device and a memory apparatus.

BACKGROUND

In recent years, development in creating a 1T1R non-volatile memory is vigorously pursued, which combines a so-called resistance-change memory device recording low-resistance/high-resistance states by applying an electric pulse with a transistor array.

As a fabrication process of the resistance-change memory device, a method of forming a memory layer and an upper electrode on a bottom electrode processed in each bit to thereby form a memory device at a contact portion between the bottom electrode and the memory layer is known in related art (for example, refer to International publication WO2008/117371 pamphlet (Patent Document 1), (paragraph 0072)).

SUMMARY

However, there is a problem in related art that it is difficult to obtain uniform element characteristics as the contact area varies between the bottom electrode and the memory layer due to misalignment of the memory layer and the upper electrode with respect to the bottom electrode. Particularly in a case of a high-density memory apparatus, variation of the contact area between the bottom electrode and the memory layer caused by misalignment is a more serious problem as it is desirable to form the size or the interval of the bottom electrodes as small as possible.

In view of the above, it is desirable to provide a manufacturing method of a memory apparatus capable of suppressing variation of the contact area between the bottom electrode and the memory layer, memory devices and the memory apparatus.

An embodiment of the present disclosure is directed to a manufacturing method of a memory apparatus in which plural memory devices according to an embodiment of the present disclosure are formed including the following (A) to (D).

(A) forming a bottom electrode material film and shaping the bottom electrode material film into a first linear pattern extending in a first direction as a first process, (B) forming a memory layer material film and an upper electrode material film in this order on the bottom electrode material film after the first process as a second process, (C) forming the upper electrodes and the memory layers by shaping the upper electrode material film and the memory layer material film into a second linear pattern extending in a second direction intersecting with the first direction as a third process and (D) forming the bottom electrodes having a quadrangle plane shape at regions where the first linear pattern intersect with the second linear pattern by shaping the bottom electrode material film into the second linear pattern after the third process as a fourth process.

The quadrangle may include at least one curved edge, in addition to quadrangles having straight-line four edges such as a square, a rectangle, a rhombus and a parallelogram.

Another embodiment of the present disclosure is directed to a memory device including a bottom electrode having a quadrangle plane shape, a memory layer provided on the bottom electrode so that two lines extended from two opposed edges of the quadrangle are taken as profile lines, and a resistance value of which reversibly varies by voltage application and an upper electrode provided on the memory layer in the same shape as the memory layer.

Still another embodiment of the present disclosure is directed to a memory apparatus including plural memory devices.

In the memory device according to the embodiment, the memory layer is provided on the bottom electrode having the quadrangle plane shape so that two lines extended from two opposed edges of the quadrangle are taken as profile lines, and the upper electrode is provided on the memory layer in the same shape as the memory layer. Therefore, the memory layer touches the whole upper surface of the bottom electrode, which improves element characteristics. Accordingly, when the memory apparatus is formed by integrating plural memory devices, variation in the contact area between the bottom electrode and the memory layer drastically reduces and uniform characteristics can be obtained.

In the manufacturing method according to the embodiments of the present disclosure, the bottom electrode material film is shaped into the first linear pattern extending in the first direction, then, the memory layer material film and the upper electrode material film are formed on the bottom electrode material film in this order, and the upper electrode material film and the memory layer material film are shaped into the second linear pattern extending in the second direction intersecting with the first direction to thereby form the upper electrodes and the memory layers. Then, the bottom electrodes having the quadrangle plane shape are formed at regions where the first linear pattern intersects with the second linear pattern by shaping the bottom electrode material film into the second linear pattern. As a result, it is possible to drastically reduce misalignment of the memory layer and the upper electrode with respect to the bottom electrodes and to suppress variation of the contact area between the bottom electrode and the memory layer, thereby obtaining uniform element characteristics.

In the memory device according to the embodiments of the present disclosure, the memory layer is provided on the bottom electrode having the quadrangle plane shape so that two lines extended from two opposed edges of the quadrangle are taken as profile lines, and the upper electrode is provided on the memory layer in the same shape as the memory layer, therefore, the memory layer touches the whole upper surface of the bottom electrode, which improves element characteristics. Accordingly, when the memory apparatus is formed by integrating plural memory devices, uniform element characteristics can be obtained.

DETAILED DESCRIPTION

Hereinafter, embodiments of the present disclosure will be explained in detail with reference to the drawings. The explanation will be made in the following order.

1. First Embodiment (an example in which a plane shape of a bottom electrode is a quadrangle)
2. Second Embodiment (an example in which an insulative sidewall is provided at the same side surface of two opposed edges of a quadrangle)

First Embodiment

Figure 1:
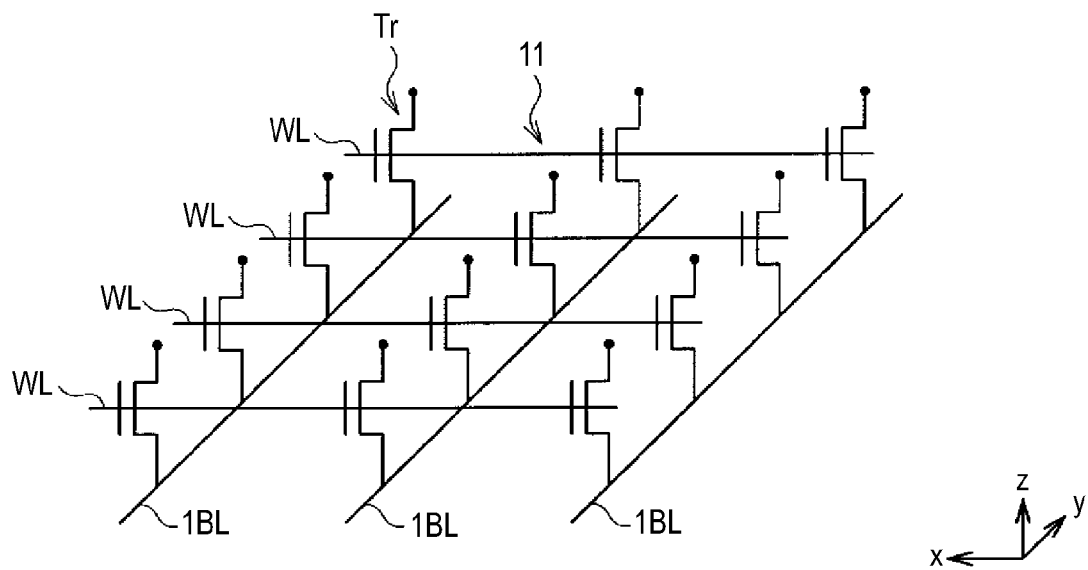
FIG. 1 is a perspective view showing a manufacturing method of a memory apparatus according to a first embodiment of the present disclosure in the process order.
Figure 12:
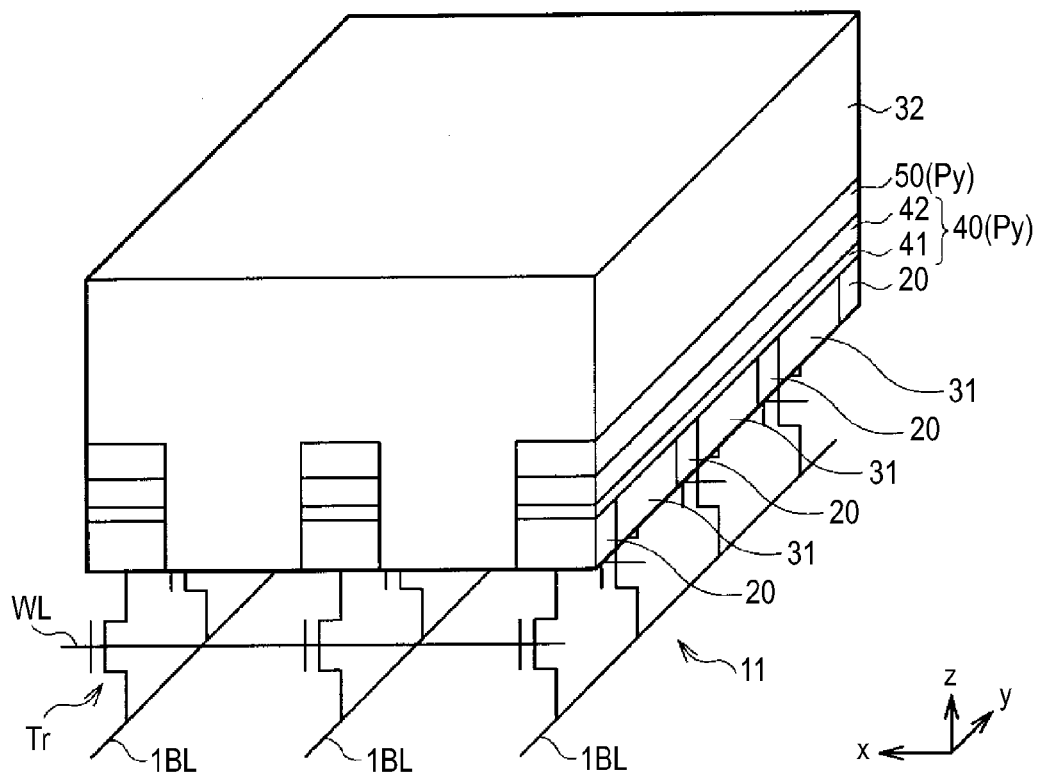
FIG. 12 is a perspective view showing a process continued from FIG. 6.

FIG. 1 to FIG. 6 as well as FIG. 12 show a manufacturing method of a memory apparatus according to a first embodiment of the present disclosure in the process order. First, a transistor array 11 is formed on a substrate 10 (not shown in FIG. 2, refer to FIG. 7) which is a silicon wafer or the like as shown in FIG. 1. In the transistor array 11, first bit lines 1BL and word lines WL are formed in a matrix state as well as transistors Tr are arranged at intersections of first bit lines 1BL and word lines WL. One of a source or a drain of the transistor Tr is connected to a bottom electrode 20 of later-described each memory device 1. The word line WL is connected to a gate of the transistor Tr. The other of the source or the drain of the transistor Tr is connected to a first bit line 1BL. A later-described upper electrode 50 of the memory device 1 doubles as a second bit line 2BL. The transistor array 11 is shown by circuit symbols for simplification in FIG. 1 to FIG. 6 as well as FIG. 12. In the following explanation, an extending direction of the word line WL is an x-direction, an extending direction of the bit line BL is a y-direction and a layer-stacking direction is a z-direction.

Figure 2:
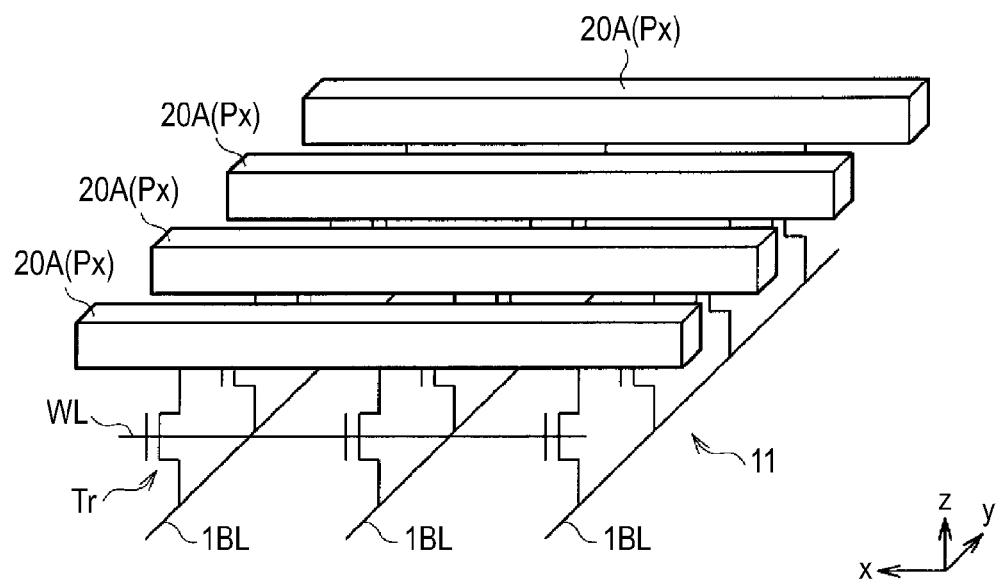
FIG. 2 is a perspective view showing a process continued from FIG. 1.

Next, as shown in FIG. 2, a bottom electrode material film 20A made of, for example, titanium nitride (TiN) is formed on the substrate 10 (not shown in FIG. 2, refer to FIG. 7) where the transistor array 11 is formed, then, the bottom electrode material film 20A is shaped into a first linear pattern Px with one or preferably plural parallel lines extending in a first direction (for example, x-direction) (first process). The linear pattern (line pattern) can be formed to have the minute width by a lithography technique commonly used in semiconductor manufacture, which is different from a dotted pattern, therefore, an etching mask can be easily formed. As materials for forming the bottom electrode material film 20A, wiring materials used for semiconductor processes can be used in addition to titanium nitride (TiN), specifically, tungsten (W), tungsten nitride (WN), tantalum nitride (TaN) and so on can be cited.

Figure 3:
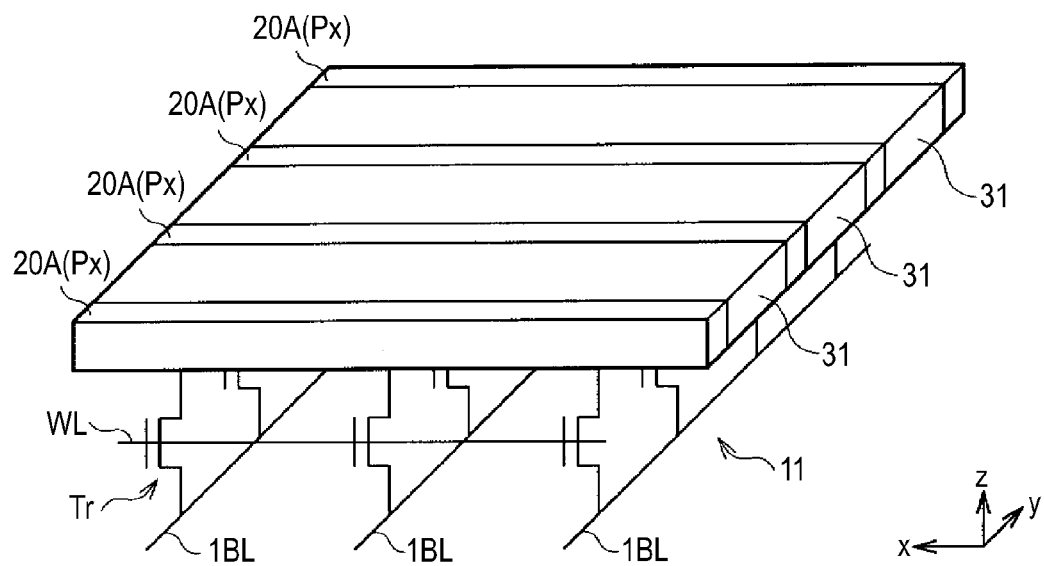
FIG. 3 is a perspective view showing a process continued from FIG. 2.

Subsequently, as shown in FIG. 3, an insulating film 31 made of silicon nitride, silicon oxide or the like is embedded in regions between the bottom electrode material films 20A.

As another method of forming the bottom electrode material films 20A, it is possible that the insulating film 31 is formed on the substrate 10 (not shown in FIG. 2, refer to FIG. 7) where the transistor array 11 is formed and a trench pattern is formed by etching the insulating film 31, then, the bottom electrode material film 20A is embedded in the trench pattern.

Figure 4:
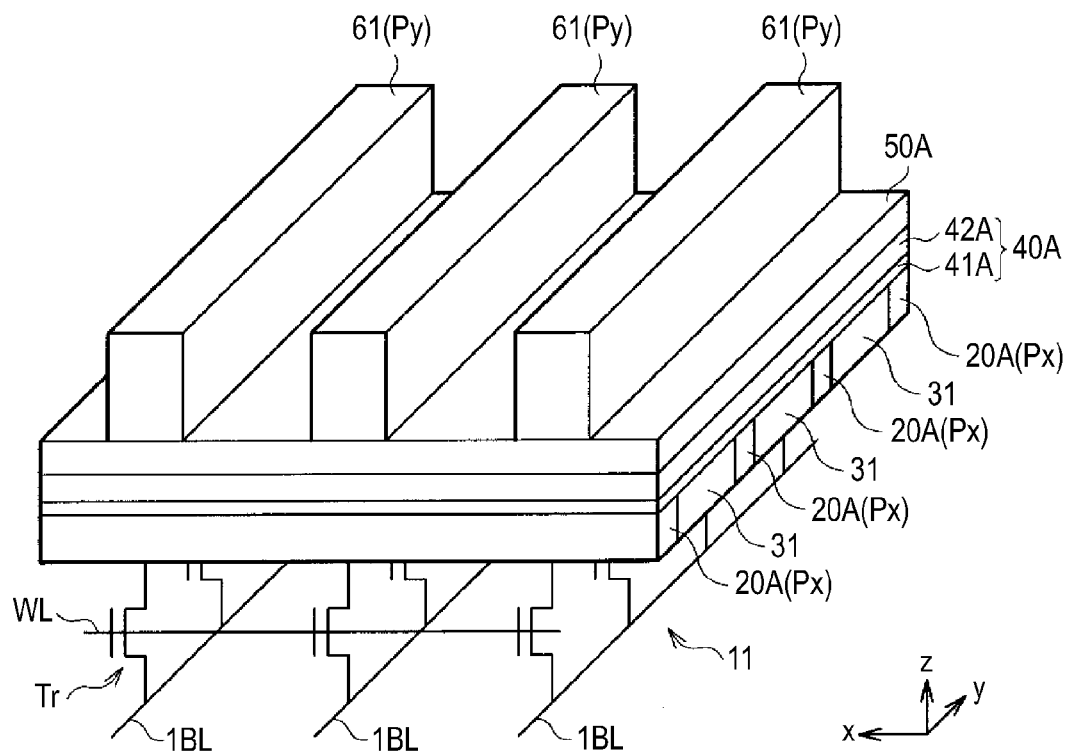
FIG. 4 is a perspective view showing a process continued from FIG. 3.

After the bottom electrode material film 20A is shaped into the first linear pattern Px, a memory layer material film 40A and an upper electrode material film 50A are formed in this order on the bottom electrode material film 20A as shown in FIG. 4 (second process). It is not necessary that the memory layer material film 40A is a single film and a two-layer structure can be applied, in which, for example, a resistance-change layer material film 41A made of gadolinium oxide (GdOx) and an ion-source layer material film 42A made of a CuTe-based material are sequentially stacked from the side of the bottom electrode material film 20A.

The ion-source layer material film 42A includes at least one kind of chalcogen element in tellurium (Te), sulfur (S) and selenium (Se) as an ion conductive material to be an anion. The ion-source layer material film 42A also includes zirconium (Zr) and/or cupper (Cu) as a metal element which can be a cation, and further includes aluminum (Al) and/or germanium (Ge) as an element which forms an oxide at the time of erasing information. Specifically, the ion-source layer material film 42A has a thickness of, for example, approximately 60 nm, which is made of a CuTe-based material having compositions of ZrTeAl, ZrTeAlGe, CuZrTeAl and GeTeCuZrAl. The ion-source layer material film 42A may include other elements in addition to the above, such as silicon (Si).

The resistance-change layer material film 41A is provided between the ion-source layer material film 42A and the bottom electrode material film 20A. The resistance-change layer material film 41A is made of a material having a higher resistance value than the ion-source layer material film 42A, which will be a resistance change layer 41 for stabilizing information holding characteristics in the memory device after completion as a barrier on electric conduction. As materials for forming the resistance-change layer material film 41A, for example, an oxide or a nitride including at least one kind of a rare-earth element such as gadolinium (Gd), aluminum (Al), magnesium (Mg), tantalum (Ta), silicon (Si) and copper (Cu) can be cited. Additionally, transition metal oxide films, AlTe, $Al_2O_3$ can be also used. The thickness of the resistance-change layer material film 41A is, for example, approximately 1 nm.

It is also not necessary that the upper electrode material film 50A is a single film and multilayer films of various compositions can be used in consideration of resistance values, membrane stress, adhesiveness and chemical stability at a contact surface with respect to the memory layer material film 40A. As materials for forming the upper electrode material film 50A, for example, wiring materials used for well-known semiconductor processes can be used as in the bottom electrode material film 20A, specifically, tungsten (W) can be cited.

After forming the memory layer material film 40A and the upper electrode material film 50A, an etching mask (resist mask) 61 having one or preferably plural parallel linear lines extending in a second direction (for example, y-direction) perpendicular to the first direction is formed on the upper electrode material film 50A also as shown in FIG. 4.

Figure 5:
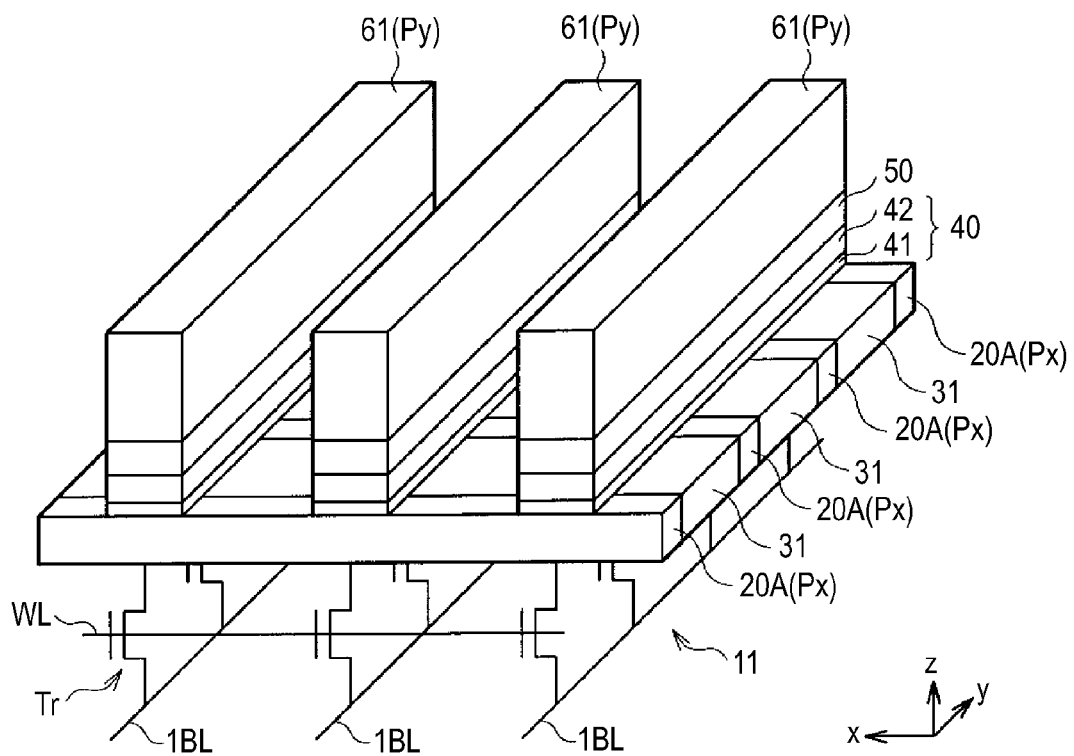
FIG. 5 is a perspective view showing a process continued from FIG. 4.

Subsequently, as shown in FIG. 5, the upper electrode material film 50A and the memory layer material film 40A are shaped into a second linear pattern Py with one or preferably plural parallel lines extending in the second direction (for example, y-direction) perpendicular to the first direction by dry etching, for example, RIE (Reactive Ion Etching) using the etching mask 61. As a result, the linear upper electrodes 50 and the memory layers 40 are formed on the bottom electrode material film 20A and the insulating film 31 in the same shape (third process). The memory layers 40 have a two-layer structure in which, for example, the resistance change layer 41 and an ion-source layer 42 are sequentially stacked from the side of the bottom electrode material film 20A.

Figure 6:
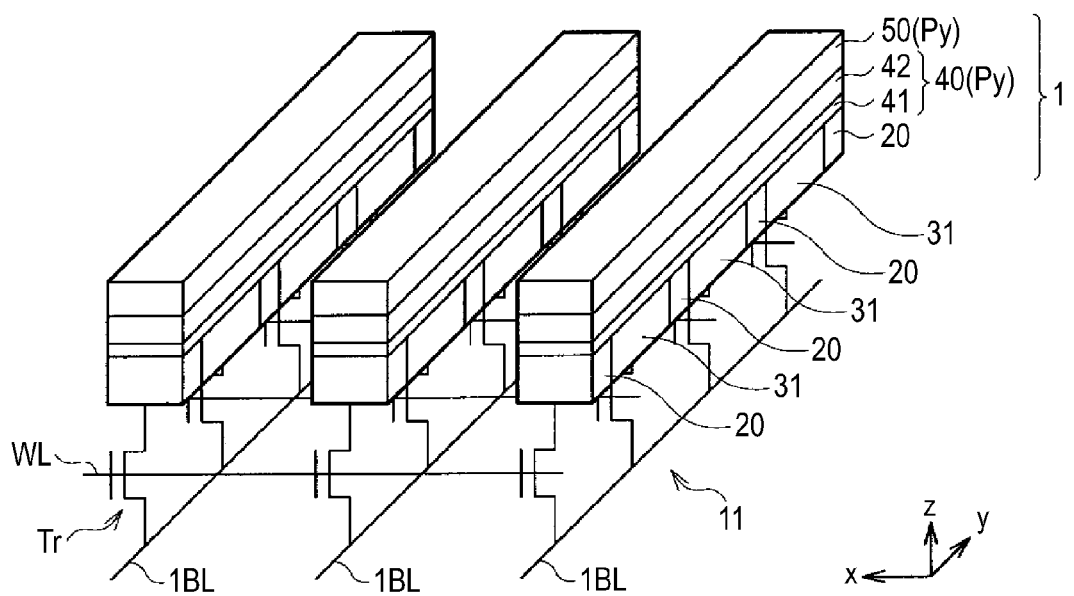
FIG. 6 is a perspective view showing a process continued from FIG. 5.
Figure 7:
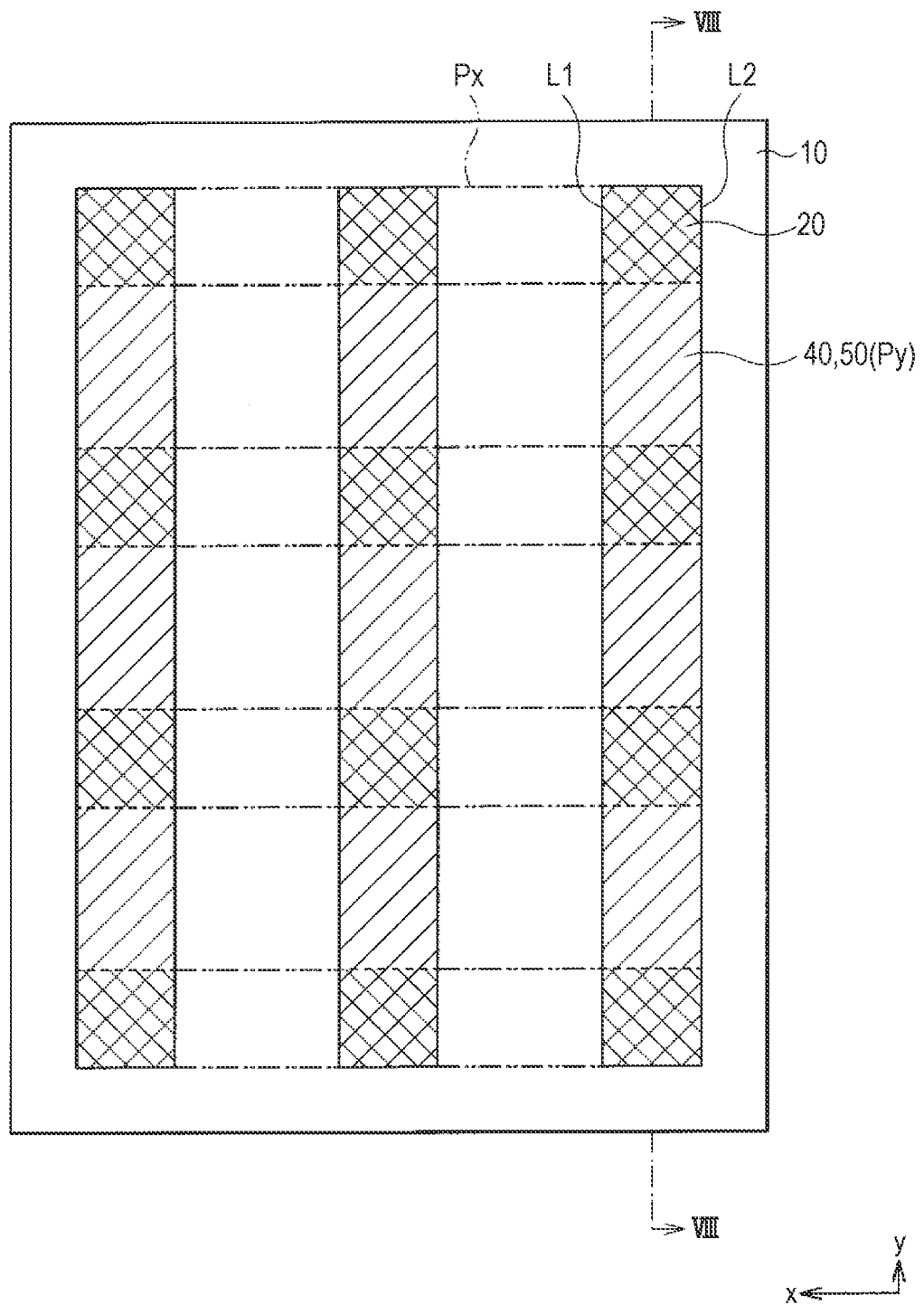
FIG. 7 is a plan view of FIG. 6.
Figure 8:
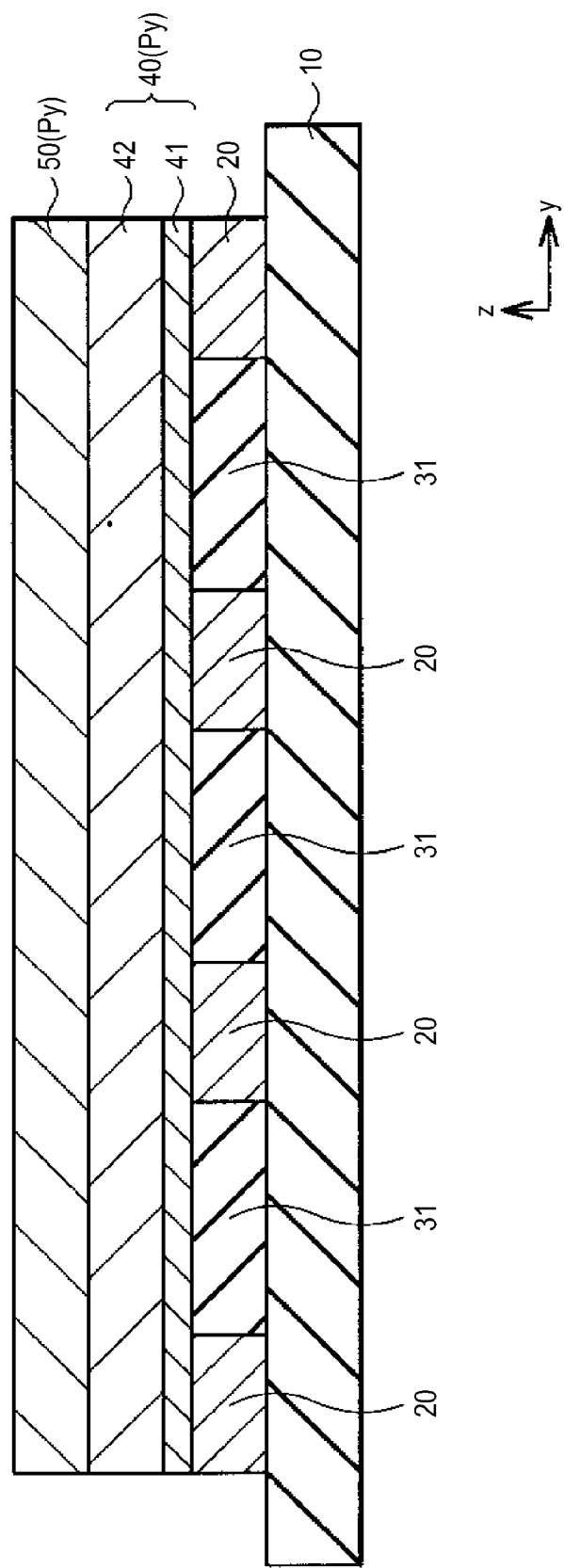
FIG. 8 is a cross-sectional view taken along a line VIII-VIII of FIG. 7.

After shaping the upper electrode material film 50A and the memory layer material film 40A into the second linear pattern Py, the bottom electrode material film 20A is continuously shaped into the second linear pattern Py by dry etching using the etching mask 61, the upper electrode material film 50A and the memory layer material film 40A which have been processed to the second linear pattern Py as masks, then, the etching mask 61 is removed as shown in FIG. 6. Accordingly, bottom electrodes 20 having a quadrangle plane shape (for example, a square in FIG. 7) are formed at regions where the first linear pattern Px intersects with the second linear pattern Py as shown in FIG. 7 and FIG. 8 (fourth process). The bottom electrodes 20 are formed in a self-aligning manner with respect to the memory layers 40 and the upper electrodes 50, thereby reducing misalignment of the memory layer 40 and the upper electrode 50 with respect to the bottom electrodes 20, which suppress the variation of the contact area between the bottom electrode 20 and the memory layer 40. As a result, variation in element characteristics caused by the misalignment can be suppressed and uniform element characteristics can be obtained.

The plane shape of the bottom electrodes 20 can be a rectangle in addition to the square shown in FIG. 7 according to the width of the first linear pattern Px and the second linear pattern Py. In FIG. 7, downward-sloping lines are added to the bottom electrodes 20 and upward-sloping lines are added to the memory layers 40 and the upper electrodes 50.

The memory device 1 including the memory layer 40 between the bottom electrode 20 and the upper electrode 50 is formed in the above manner. Each bottom electrode 20 is connected to a corresponding transistor Tr of the transistor array 11. The memory layer 40 is provided on the bottom electrodes 20 so that two lines L1, L2 extended from two opposed edges of the quadrangle of the bottom electrode 20 are taken as profile lines. The upper electrode 50 is provided on the memory layer 40 in the same shape as the memory layer 40. Therefore, the memory layers 40 touch the entire upper surface of the bottom electrodes 20, which improves element characteristics.

Figure 9A:
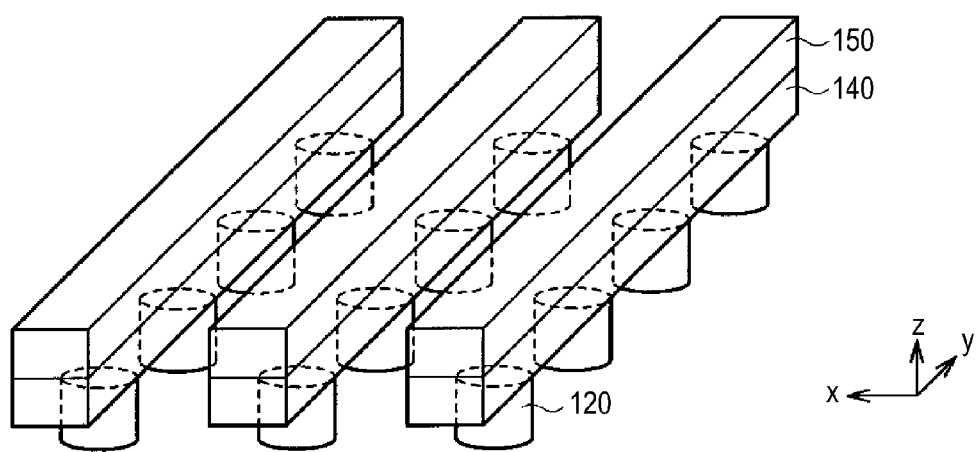
FIGS. 9A and 9B are perspective views for explaining a problem in a related-art manufacturing method.
Figure 9B:
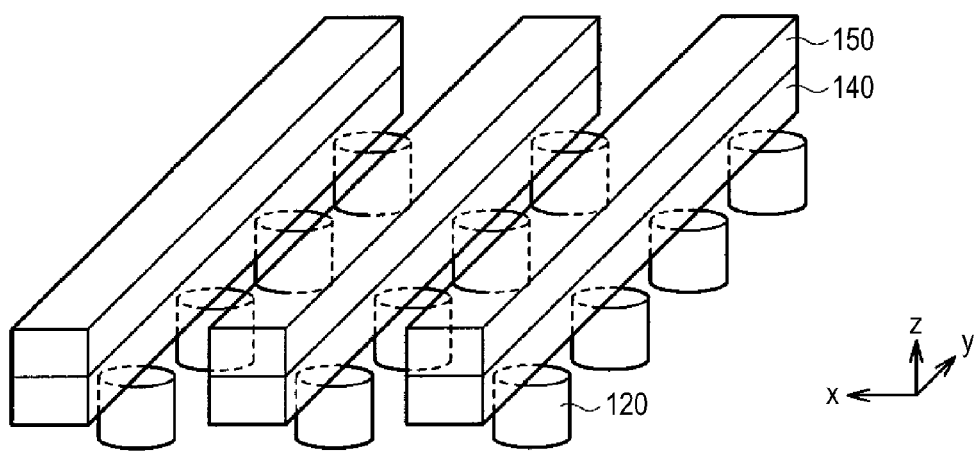
Figure 10A:
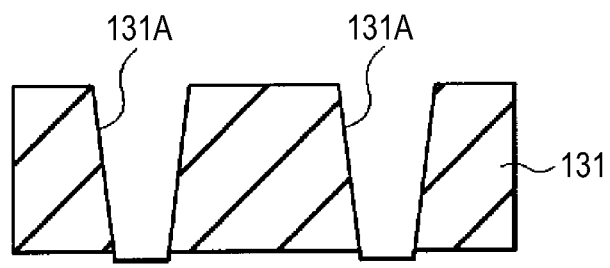
FIGS. 10A to 10D are cross-sectional views for explaining another problem in the related-art manufacturing method.
Figure 10B:
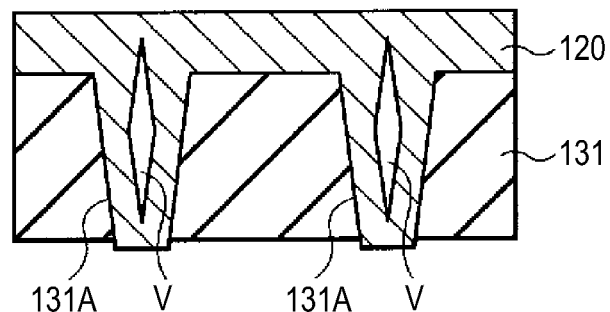
Figure 10C:
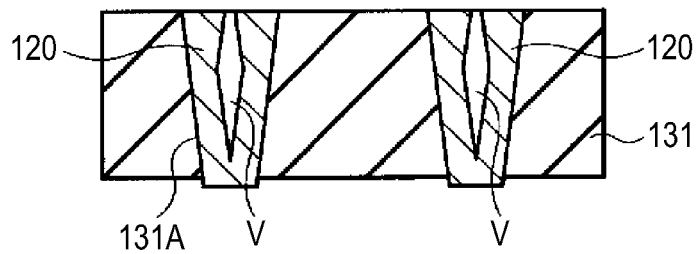
Figure 10D:
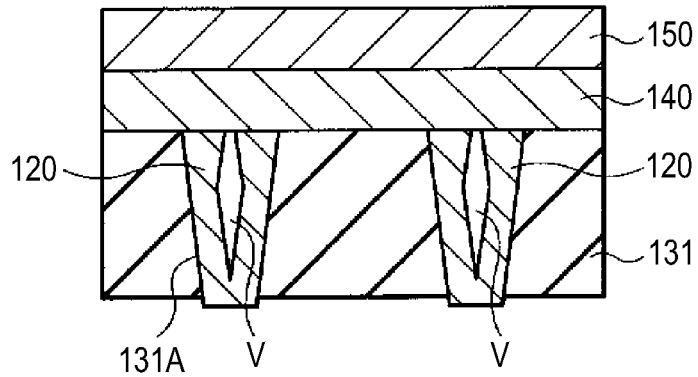

On the other hand, in related art, bottom electrodes 120 are formed in a dotted pattern, then, memory layers 140 and upper electrodes 150 are formed on the bottom electrodes 120 in the linear pattern as shown in FIG. 9A. As the contact area between the bottom electrode 120 and the memory layer 140 varies due to misalignment of the memory layer 140 and the upper electrode 150 with respect to the bottom electrodes 120 as shown in FIG. 9B, it is difficult to obtain uniform characteristics. Particularly, in the case where the size or the interval of the bottom electrodes 120 are formed as small as possible for making the memory apparatus high in density, the problem of variation in element characteristics caused by misalignment becomes prominent.

Also in related art, a circular hole pattern 131A is provided in an insulating film 131 and a bottom electrode material film 120A is embedded in the hole pattern 131A, then, the bottom electrode material film 120A at regions other than the hole pattern is removed by etching, CMP (Chemical Mechanical Polishing) or the like to thereby form bottom electrodes 120 as shown in FIG. 10. However, when the bottom electrode material film 120A is embedded in the hole pattern 131A in the related-art method, hollow portions V called voids are generated due to incomplete embedding in many cases. Accordingly, it is difficult to form the memory devices in an ideal state due to the voids V, which causes production defects.

In response to the above, the bottom electrode material film 20A is processed into the first linear pattern Px, then, processed into the second linear pattern Py which are perpendicular to the first linear pattern Px in the embodiment, therefore, the voids V are not generated and production defects caused by the voids V can be suppressed. In the case where the bottom electrode material film 20A is embedded in the trench pattern of the insulating film 31, materials which can be deposited by plating such as copper are used as the bottom electrode material film 20A, thereby avoiding generation of voids V.

Figure 11:
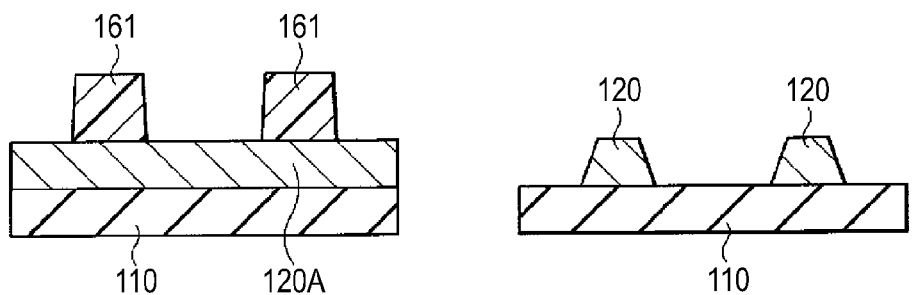
FIG. 11 is a cross-sectional view for explaining further another problem of the related-art manufacturing method.

As another example of a related-art manufacturing method, there is a method in which the bottom electrode material film 120A is deposited on the whole surface of a substrate 110, a mask 161 with a pattern of dots the plane shape of which is circle is formed on the bottom electrode material film 120A and the bottom electrode material film 120A is processed by etching using the mask 161 to thereby form the bottom electrodes 120 of the dot pattern as shown in FIG. 11. However, it is difficult to form a dot pattern with the minute size equivalently to the hole pattern in lithography normally used in semiconductor processes, therefore, it is necessary to increase the element size in each bit, which hinders the elements from being high in density.

In response to the above, the bottom electrode material film 20A is processed into the first linear pattern Px, then, processed into the second linear pattern Py which are perpendicular to the first linear pattern Px in the embodiment. The linear pattern (line pattern) can be formed to have the minute width by the lithography technique commonly used in semiconductor manufacture, which is different from the case of the dot pattern, therefore, it is not necessary to increase the size of the bottom electrodes 20. The same applies to the case in which the bottom electrode material film 20A is embedded in the trench pattern provided in the insulating film 31 in the process shown in FIG. 3. Accordingly, it is possible to reduce the size or the interval of the bottom electrodes 20, which will be so advantageous to make the high density device.

It is desirable that the bottom electrode material film 20A is shaped into the second linear pattern Py, then, an insulating film 32 made of silicon nitride or silicon oxide is formed over the whole surface of the substrate 10 so that the entire memory apparatus is covered with the insulating film as shown in FIG. 12. Furthermore, a voltage-pulse generation circuit is connected to each of plural lines of the second linear pattern Py of the upper electrodes 50 which double as the second bit lines 2BL as a circuit for controlling the potential of the memory devices 1. The voltage pulse generation circuit is also connected to each word line WL and each first bit lines 1BL. The memory apparatus having plural memory devices 1 on the substrate 10 is completed by the above processes.

In the memory apparatus, when a voltage pulse or a current pulse is applied from a not-shown power supply (a pulse application means) through the bottom electrode 20 and the upper electrode 50 of each memory device 1, electric characteristics of the memory layer 40, for example, the resistance value varies reversibly, thereby performing wiring, erasing and reading of information. Specific operation will be explained as follows.

First, positive voltage is applied to the memory devices 1 so that, for example, the upper electrode 50 side is in a positive potential and the bottom electrode 20 side is in a negative potential. Accordingly, cations of Cu and/or Zr are conducted from the ion-source layer 42 are coupled to electrons and deposited in the resistance change layer 41 on the bottom electrode 20 in each memory device 1, as a result, a conductive path (filament) of low-resistance Zr and/or Cu reduced to a metal state is formed between the bottom electrode 20 and the ion-source layer 42. Or, the conductive path is formed in the memory layer 40. Therefore, the resistance value of the memory layer 40 is decreased, namely, the high-resistance state as the initial state is changed to the low-resistance state.

The low-resistance state is maintained even when the positive voltage is removed and there is no voltage applied to the memory devices 1. Information has been written by the above process. When used for a memory apparatus which can perform writing just once, namely, a so-called PROM (Programmable Read Only Memory), the recording is completed only by the above recording process.

On the other hand, an erasing process is necessary for application to memory apparatus capable of erasing information, namely, a RAM (Random Access Memory), an EEPROM (Electronically Erasable and Programmable Read Only Memory) and so on. In the erasing process, negative voltage is applied to the memory devices 1 so that, for example, the upper electrode 50 side is in a negative potential and the bottom electrode 20 side is in a negative potential. Accordingly, Zr and Cu of the conductive path formed in the memory layer 40 are oxidized and ionized, then, dissolved to the memory layer 40 or coupled to Te and the like to thereby form compounds such as Cu2, Te, CuTe and so on. Then, the conductive paths of Zr and Cu disappear or reduce, and the resistance value is increased. Or, additive elements such as Al or Ge also existing in the memory layer 40 form an oxide film on an anode pole, then, the state is changed to the high-resistance state.

The state in which the resistance value is high is maintained even when the negative voltage is removed and there is no voltage applied to the memory devices 1. The written information can be erased by the above process. It is possible to perform writing of information and erasing of the written information with respect to the memory device 1 repeatedly by repeating the above processes.

For example, when the state in which the resistance value is high corresponds to information of "0" and the state in which the resistance value is low corresponds to information "1" respectively, it is possible to change the state from "0" to "1" in the recording process of information by application of positive voltage and to change the state from "1" to "0" in the erasing process of information by application of negative voltage.

To which state transition of the state transition of high to low and the state transition of low to high the writing operation and the erasing operation correspond depends on the matter of definition. In the specification, the state transition of high to low is defined as the writing state and the state transition of low to high is defined as the erasing state.

In this case, in each memory device 1, the memory layer 40 is provided on the bottom electrode 20 having a quadrangle plane shape so that two lines L1, L2 extended from two opposed edges of the quadrangle are taken as profile lines. As the upper electrode 50 is provided on the memory layer 40 in the same shape as the memory layer 40, the memory layer 40 touches the whole upper surface of the bottom electrode 20, thereby obtaining good characteristics. Accordingly, in the memory apparatus manufactured by integrating plural memory devices 1, variation in the contact area between the bottom electrode 20 and the memory layer 40 is extremely small, which uniformizes element characteristics.

In the manufacturing method of the memory apparatus according to the embodiment, the bottom electrode material film 20A is shaped into the first linear pattern Px extending in the first direction, the memory layer material film 40A and the upper electrode material film. 50A are formed on the bottom electrode material film 20A in this order, and the memory layer material film 40A and the upper electrode material film 50A are shaped into the second linear pattern Py extending in the second direction perpendicular to the first direction to thereby form the upper electrodes 50 and the memory layers 40. Then, the bottom electrode material film 20A is shaped into the second linear pattern Py to thereby form the bottom electrodes 20 having a quadrangle plane shape at regions where the first linear pattern Px intersect with the second linear pattern Py. Therefore, the bottom electrodes 20 can be formed in a self-aligning manner with respect to the memory layers 40 and the upper electrodes 50, thereby drastically reducing misalignment of the memory layer 40 and the upper electrode 50 with respect to the bottom electrodes 20. It is also possible to suppress production defects caused by voids in the bottom electrodes 20 as well as to reduce the size and the interval of the bottom electrodes 20, which are so advantageous to make the miniaturized and high-density device.

In the memory device 1 according to the embodiment, the memory layer 40 is provided on the bottom electrode 20 having a quadrangle plane shape so that two lines L1, L2 extended from two opposed edges of the quadrangle are taken as profile lines, and the upper electrode 50 is provided on the memory layer 40 in the same shape as the memory layer 40, therefore, the memory layer 40 touches the whole upper surface of the bottom electrode 20, thereby obtaining good characteristics. Accordingly, the memory apparatus manufactured by integrating plural memory devices 1 can obtain uniform element characteristics.

The memory apparatus according to the embodiment can be applied to various memory devices as described above. For example, the memory apparatus can be applied to any memory configurations such as the PROM (Programmable Read Only Memory) which can perform writing just once, the EEPROM (Electronically Erasable and Programmable Read Only Memory) which can erase information electrically and the so-called RAM (Random Access Memory) which can perform writing, erasing and reproduction at high speed.

Second Embodiment

FIGS. 13A to 13D show a manufacturing method of a memory apparatus according to a second embodiment of the present disclosure in the process order. The manufacturing method differs from the first embodiment in a point that a sidewall 70 made of an insulating material is provided at the ion-source layer 42 and the upper electrode 50 to thereby suppress a short-circuit failure at a sidewall portion of the resistance change layer 41. Therefore, the same numerals and signs are given to the same components as the first embodiment for explanation. Processes overlapped with the first embodiment will be explained with reference to FIG. 1 to FIG. 6 as well as FIG. 12.

First, the transistor array 11 is formed on the substrate 10 by the process shown in FIG. 1 in the same manner as the first embodiment.

Next, the bottom electrode material film 20A is formed on the substrate 10, and the bottom electrode material film 20A is shaped into the first linear pattern Px with one or preferably plural lines extending in the first direction (for example, x-direction) (first process) by the process shown in FIG. 2.

Subsequently, the insulating film 31 is embedded in regions formed in the bottom electrode material film 20A by the process shown in FIG. 3 in the same manner as the first embodiment. It is also preferable that the insulating film 31 is formed on the substrate 10 and the trench pattern is formed by etching the insulating film 31, then, the bottom electrode material films 20A is embedded in the trench pattern.

Figure 13A:
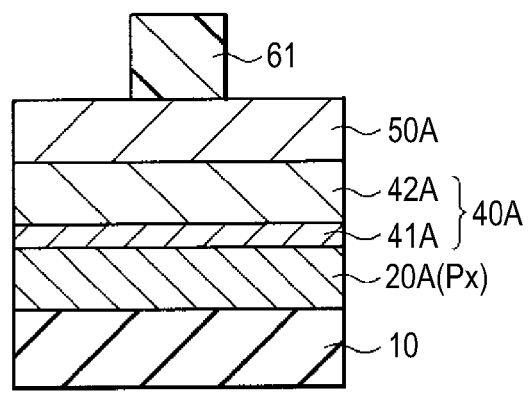
FIGS. 13A to 13D are cross-sectional views showing a manufacturing method of a memory apparatus according to a second embodiment of the present disclosure in the process order.

After that, the memory layer material film 40A and the upper electrode material film 50A are formed on the bottom electrode material film 20A in this order as shown in FIG. 13A in the same manner as the first embodiment, and the etching mask 61 which is formed to have one or preferably plural parallel linear lines extending in a second direction (for example, y-direction) perpendicular to the first direction is formed on the upper electrode material film 50A.

Figure 13B:
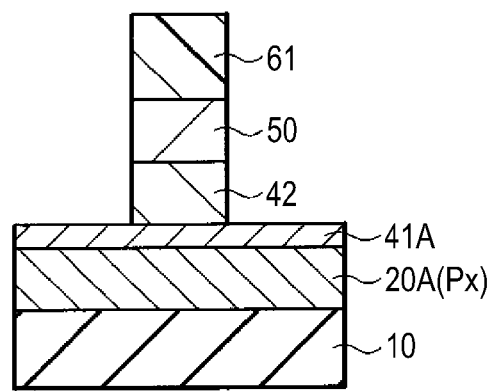

After forming the etching mask 61 on the upper electrode material film 50A, the upper electrode material film 50A and the ion-source layer material film 42A are shaped into the second linear pattern Py extending in the second direction (for example, y-direction) perpendicular to the first direction by dry etching using the etching mask 61, and the etching is stopped at an interface between the ion-source layer material film 42A and the resistance-change layer material film 41A or in the vicinity thereof as shown in FIG. 13B. As a result, the linear upper electrode 50 and the ion-source layer 42 are formed on the bottom electrode material film 20A and the insulating film 31 in the same shape (third process).

Figure 13C:
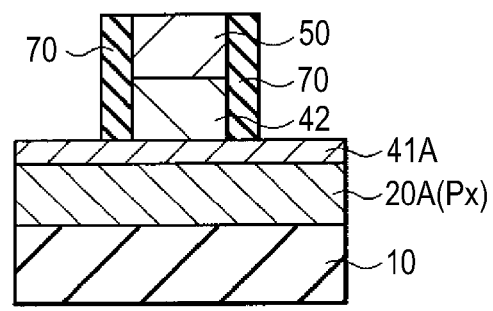

After the upper electrode material film 50A and the ion-source layer material film 42A are shaped into the second linear pattern Py, the etching mask 61 is removed. Subsequently, the sidewall 70 made of an insulating material such as silicon nitride or silicon oxide is formed at side surfaces of the linear upper electrode 50 and the ion-source layer 42 as shown in FIG. 13C. The sidewall 70 can be formed easily, for example, by forming a sidewall material film made of the above insulating material on the whole surface of the substrate 10, then, etching back the film.

Figure 13D:
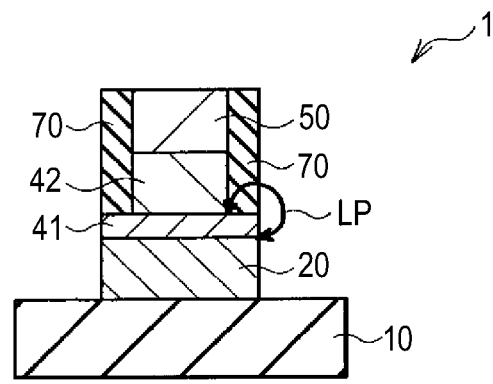

After forming the sidewall 70, the resistance-change layer material film 41A is continuously shaped into the second linear pattern Py by dry etching using the sidewall 70, the upper electrode 50 and the ion-source layer 42 as masks as shown in FIG. 13D. Accordingly, the linear resistance change layer 41 is formed under the upper electrode 50 and the ion-source layer 42 covered with the sidewall 70 (third process). As the resistance-change layer material film 41A, for example, an aluminum oxide film is used and the resistance-change layer material film 41A can be selectively removed by dry etching using fluorine.

Figure 14:
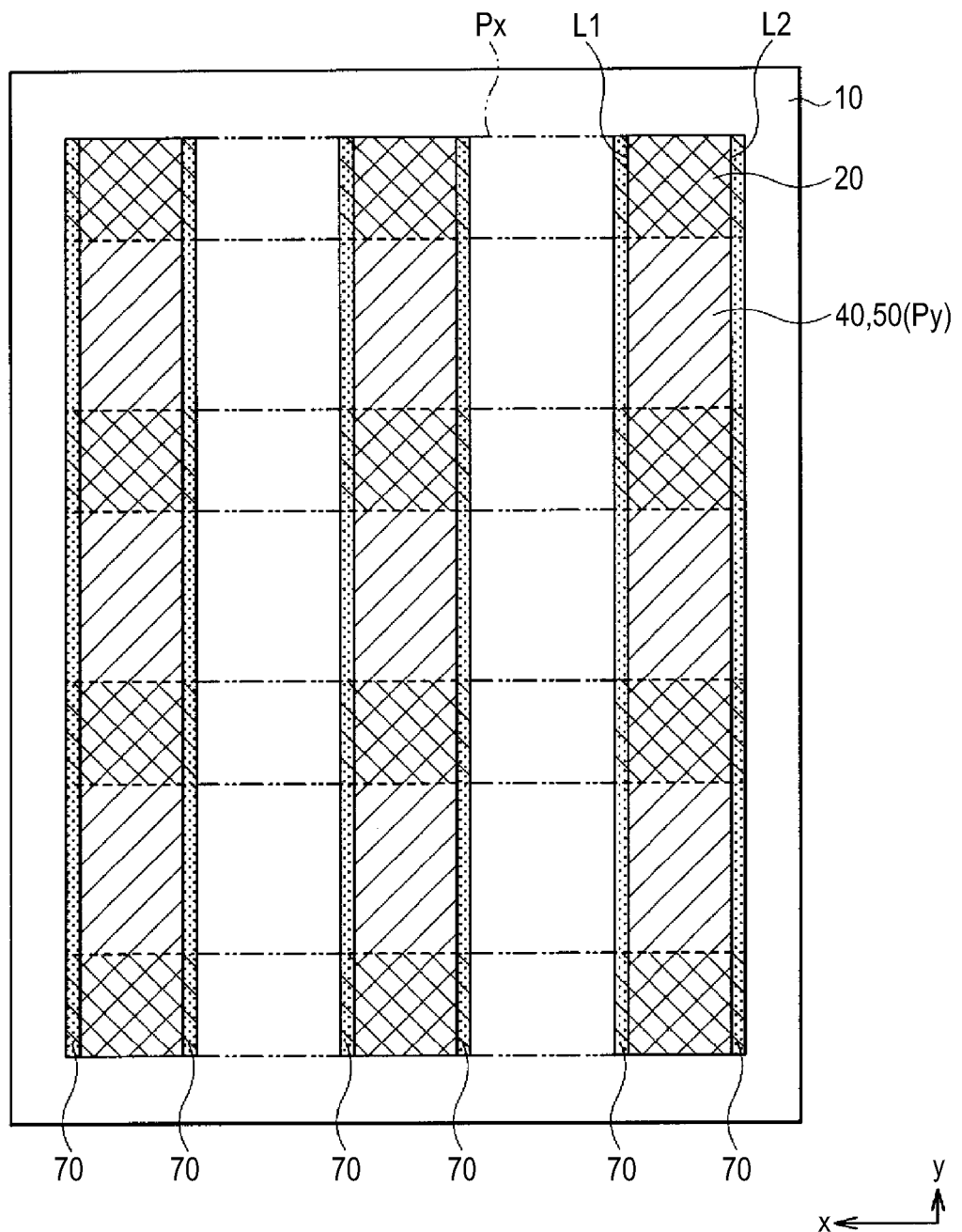
FIG. 14 is a plan view of FIGS. 13A to 13D.

After forming the resistance change layer 41, the bottom electrode material film 20A is shaped into the second linear pattern Py further continuously by dry etching using the sidewall 70, the upper electrode 50 and the ion-source layer 42 as masks also as shown in FIG. 13D. Accordingly, bottom electrodes 20 having a quadrangle plane shape are formed at regions where the first linear pattern Px intersect with the second linear pattern Py as shown in FIG. 14 (fourth process). The bottom electrodes 20 are formed in a self-aligning manner with respect to the sidewalls 70, the memory layers 40 and the upper electrodes 50, thereby reducing misalignment the sidewalls 70, the memory layer 40, and the upper electrode 50 with respect to the bottom electrodes 20, which suppress the variation of the contact area between the bottom electrode 20 and the memory layer 40. As a result, variation in element characteristics caused by the misalignment can be suppressed and uniform element characteristics can be obtained.

The plane shape of the bottom electrodes 20 can be a square according to the width of the first linear pattern Px and the second linear pattern Py, in addition to the rectangle shown in FIG. 14. In FIG. 14, downward-sloping lines are added to the bottom electrodes 20, upward-sloping lines are added to the memory layers 40 and the upper electrodes 50, and the sidewalls 70 are screened.

Figure 15:
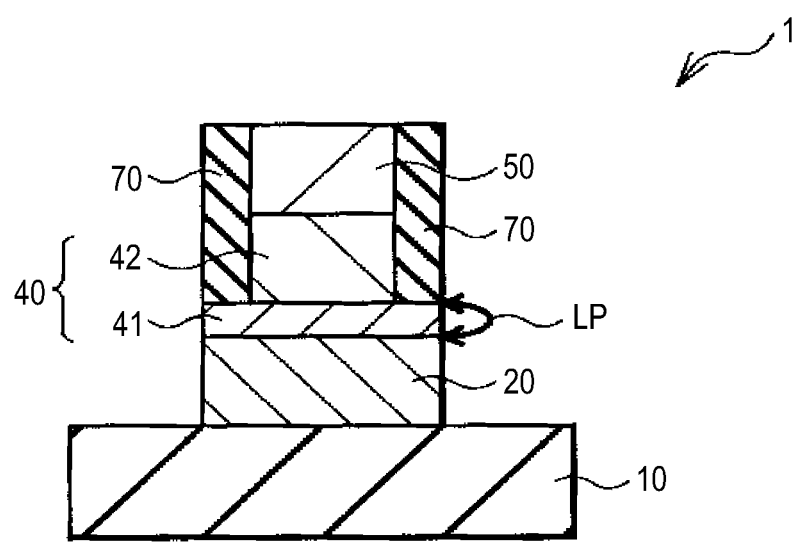
FIG. 15 is a cross-sectional view for explaining a problem occurring when a sidewall is not included.

In the case where the sidewall 70 is not provided, an insulation failure path LP is liable to occur at the sidewall of the resistance change layer 41 as shown in FIG. 15 due to the extremely thin thickness of the resistance change layer 41 which is approximately several nm. This is because there is the danger that leak current occurs between the bottom electrode 20 and the ion-source layer 42 through foreign objects adhered to the sidewall in the process of etching. In response to this, the side surfaces of the upper electrode 50 and the ion-source layer 42 are covered with the sidewall 70 made of the insulating material in the embodiment, therefore, the insulation failure path LP between the bottom electrode 20 and the ion-source layer 42 can be elongated, which can suppress the short-circuit failure.

The memory device 1 having the memory layer 40 between the bottom electrode 20 and the upper electrode 50 is formed in the above manner. Each bottom electrode 20 is connected to a corresponding transistor Tr of the transistor array 11. The memory layer 40 and the upper electrode 50 are provided to have the same shape on the bottom electrodes 20 with the sidewall 70 sandwiching both side surfaces. The sidewall 70 is provided so that two lines L1, L2 extended from two opposed edges of the quadrangle of the bottom electrode 20 are taken as profile lines. Accordingly, the bottom surface of the memory layer 40 touches the upper surface of the bottom electrode 20, which improves element characteristics.

It is desirable to cover the entire memory apparatus with the insulating film 32 by the process shown in FIG. 12 after the bottom electrode material film 20A is shaped into the second linear pattern Py in the same manner as the first embodiment. Furthermore, the voltage-pulse generation circuit is connected to each of plural lines of the second linear pattern Py of the upper electrodes 50 which double as the second bit lines 2BL as a circuit for controlling the potential of the memory devices 1. The voltage pulse generation circuit is also connected to each word line WL and each first bit lines 1BL. The memory apparatus having plural memory devices 1 on the substrate 10 is completed in the above processes.

In the memory apparatus, it is possible to perform wiring, erasing and reading of information by reversibly changing the resistance value of the memory layers 40 by voltage application in the same manner as the first embodiment. In this case, the ion-source layer 42 and the upper electrode 50 have the sidewall 70 made of the insulating film, therefore, the short-circuit failure through the side surface of the resistance change layer 41 is suppressed, which further improves characteristics.

The present disclosure has been explained by citing the embodiments, and the present disclosure is not limited to the above embodiments, and various modifications may occur.

For example, the case where the first direction and the first linear pattern Px are the x-direction, the second direction and the second linear pattern Py are the y-direction, and the first linear pattern Px is perpendicular to the second linear pattern Py has been explained in the above embodiments, however, it is not necessary that the first linear pattern Px is perpendicular to the second linear pattern Py but it is sufficient that they are provided so as to extend in directions intersecting with each other. In this case, the plane shape of the bottom electrode 20 will be other quadrangles having straight-line four edges such as a rhombus or a parallelogram according to the width and the intersection angle of the first linear pattern Px and the second linear pattern Py.

Additionally, for example, the case where the first linear pattern Px and the second linear pattern Py have straight lines has been explained in the above embodiments, however, it is not always necessary that the first linear pattern Px and the second linear pattern Py have straight lines, but it is also preferable that they have bent or curved linear lines in accordance with the structure of the transistor array 11 or the layout of the memory devices 1. In this case, the plane shape of the bottom electrode 20 may include at least one curved edge in accordance with the shape of the first linear pattern Px and the second linear pattern Py.

Furthermore, for example, materials, deposition methods and deposition conditions of respective layers explained in the above embodiments are not limited but other materials and other deposition methods can be used. For example, it is preferable that other transition metal elements can be added to the memory layer 40 within a scope not altering the above composition, for example, titanium (Ti), hafnium (Hf), vanadium (V), niobium (Nb), tantalum (Ta), chromium (Cr), molybdenum (Mo) and tungsten (W). It is also preferable to add nickel (Ni) in addition to copper (Cu), silver (Ag) and zinc (Zn).

Additionally, for example, the structure of the memory device 1 and the memory apparatus (memory cell array) have been specifically explained, however, it is not necessary that all layers are included and it is also possible to further include another layer.

Further more, for example, the case where the technology is applied to manufacturing of the resistance change memory has been explained in the above embodiments, however, the technology can be also applied to manufacturing of other memory apparatus such as a phase change memory using phase change between a crystal state and an amorphous state of chalcogenide.

The present disclosure contains subject matter related to that disclosed in Japanese Priority Patent Application JP 2010-234414 filed in the Japan Patent Office on Oct. 19, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of making a memory device, comprising the steps of:
   forming a stacked structure with a first electrode, a resistance change layer, an ion-source layer and a second electrode layered in this order on a substrate;
   reforming the second electrode and the ion-source layer such that each have a width less than a width of the resistance change layer and such that each have a width less than a width of the first electrode; and
   forming insulating sidewalls on a top surface of the resistance change layer, the insulating sidewalls abutting sides of the ion-source layer and the second electrode formed in the reforming step and having surfaces facing in the width direction.

2. The method of claim 1, further comprising:
   etching the resistance change layer using the insulating sidewalls, the second electrode, and the ion-source layer as masks such that, after the etching of the resistance change layer, the width of the resistance change layer is larger than the width of the ion-source layer.

3. The method of claim 1, wherein the reforming of the second electrode and the ion source layer includes:
   forming an etching mask on the second electrode, and
   etching the second electrode and the ion-source layer using the etching mask such that the width of the second electrode and the width of the ion-source layer is less than the width of the resistance change layer.

4. The method of claim 1, wherein ion-source layer material includes at least one chalcogen element selected from tellurium (Te), sulfur (S) and selenium (Se) as well as a metal element which can be ionized.

5. A method for making a memory apparatus having a memory layer with a reversibly variable resistance value, said method comprising:
   forming a first electrode material film comprising a metal into a first linear pattern extending in a first direction;
   providing insulation between portions of the first electrode material film that constitute the first linear pattern;
   forming a memory layer material film and a second electrode material film in this order on the first electrode material film, the memory layer material film comprising an ion-source layer material film and a resistance layer material film, the resistance layer material film being between the ion-source layer material film and the first electrode material film;
   forming a second electrode and the memory layer by shaping the second electrode material film and the memory layer material film into a second linear pattern extending in a second direction intersecting with the first direction; and
   forming a first electrode at regions where the first linear pattern intersect with the second linear pattern by shaping the first electrode material film into the second linear pattern,
   wherein,
      the forming of the second electrode and the memory layer includes:
      (a) forming insulating sidewalls at side surfaces of the second electrode and the ion-source layer, and
      (b) shaping the resistance layer material film into the second linear pattern by using the insulating sidewalls, the second electrode, and the ion-source layer as masks such that a width of the resistance layer is larger than a width of the ion-source layer, and
   the first electrode is formed such that a width of the first electrode is larger than the width of the ion-source layer.

6. The method according to claim 5, wherein
   the forming of the second electrode and the memory layer includes forming an etching mask having linear lines extending in the second direction on the second electrode material film, and processing the second electrode material film and the memory layer material film by using the etching mask, and the forming of the first electrode includes processing the first electrode material film by using the insulating sidewalls, the second electrode, and the ion-source layer as masks.

7. The method according to claim 5, wherein the ion-source layer material film includes at least one chalcogen element selected from the group consisting of tellurium (Te), sulfur (S) and selenium (Se) as well as at least one metal element which can be ionized.

8. The method according to claim 7, wherein the ion-source layer material film includes copper (Cu), zirconium (Zr), or both copper and zirconium.

9. The method according to claim 8, wherein the resistance layer material film is made of oxides or a nitride including at least aluminum (Al), magnesium (Mg), tantalum (Ta), silicon (Si), or copper (Cu).

10. The method according to claim 5, wherein the forming of the second electrode and the memory layer includes:
    forming an etching mask having linear lines extending in the second direction on the second electrode material film, and forming the second electrode and the ion-source layer by shaping the second electrode material film and the ion-source material film into the second linear pattern by using the etching mask, and
    removing the etching mask.

11. The method according to claim 5, wherein the resistance layer material film comprises a material having a higher resistance value than that of the ion-source layer material film.

* * * * *